US011018127B2

(12) United States Patent
Hsieh

(10) Patent No.: US 11,018,127 B2
(45) Date of Patent: May 25, 2021

(54) SHIELDED GATE TRENCH MOSFET WITH ESD DIODE MANUFACTURED USING TWO POLY-SILICON LAYERS PROCESS

(71) Applicant: Nami MOS CO., LTD., New Taipei (TW)

(72) Inventor: Fu-Yuan Hsieh, New Taipei (TW)

(73) Assignee: NAMI MOS CO, LTD., New Taipei (TW)

( * ) Notice: Subject to any disclaimer, the term of this patent is extended or adjusted under 35 U.S.C. 154(b) by 0 days.

(21) Appl. No.: 16/590,609

(22) Filed: Oct. 2, 2019

(65) Prior Publication Data

US 2021/0104510 A1    Apr. 8, 2021

(51) Int. Cl.
*H01L 27/02*    (2006.01)
*H01L 29/66*    (2006.01)
*H01L 29/40*    (2006.01)
*H01L 29/78*    (2006.01)
*H01L 29/423*   (2006.01)

(52) U.S. Cl.
CPC ........ *H01L 27/0255* (2013.01); *H01L 29/401* (2013.01); *H01L 29/4236* (2013.01); *H01L 29/66734* (2013.01); *H01L 29/7808* (2013.01); *H01L 29/7813* (2013.01)

(58) Field of Classification Search
CPC ....................... H01L 29/4236; H01L 27/0255
See application file for complete search history.

(56) References Cited

U.S. PATENT DOCUMENTS

| 7,855,415 | B2  |    | 12/2010 | Challa et al. |               |
|-----------|-----|----|---------|---------------|---------------|
| 9,963,969 | B2  |    | 5/2018  | Yaakoby       |               |
| 2013/0256786 | A1 | * | 10/2013 | Hsieh ................. | H01L 29/0869 |
|           |     |    |         |               | 257/330       |
| 2017/0278837 | A1 | * | 9/2017  | Hsieh .................... | H01L 23/535  |

* cited by examiner

*Primary Examiner* — Farun Lu
(74) *Attorney, Agent, or Firm* — Bacon & Thomas, PLLC

(57) ABSTRACT

A SGT MOSFET having ESD diode and a method of manufacturing the same are disclosed. The SGT trench MOSFET according to the present invention, has n+ doped shielded electrode in an N channel device and requires only two poly-silicon layers, making the device can be shrunk with reducing shielded gate width for Rds reduction without increasing switching loss and having dynamic switching instability.

5 Claims, 21 Drawing Sheets

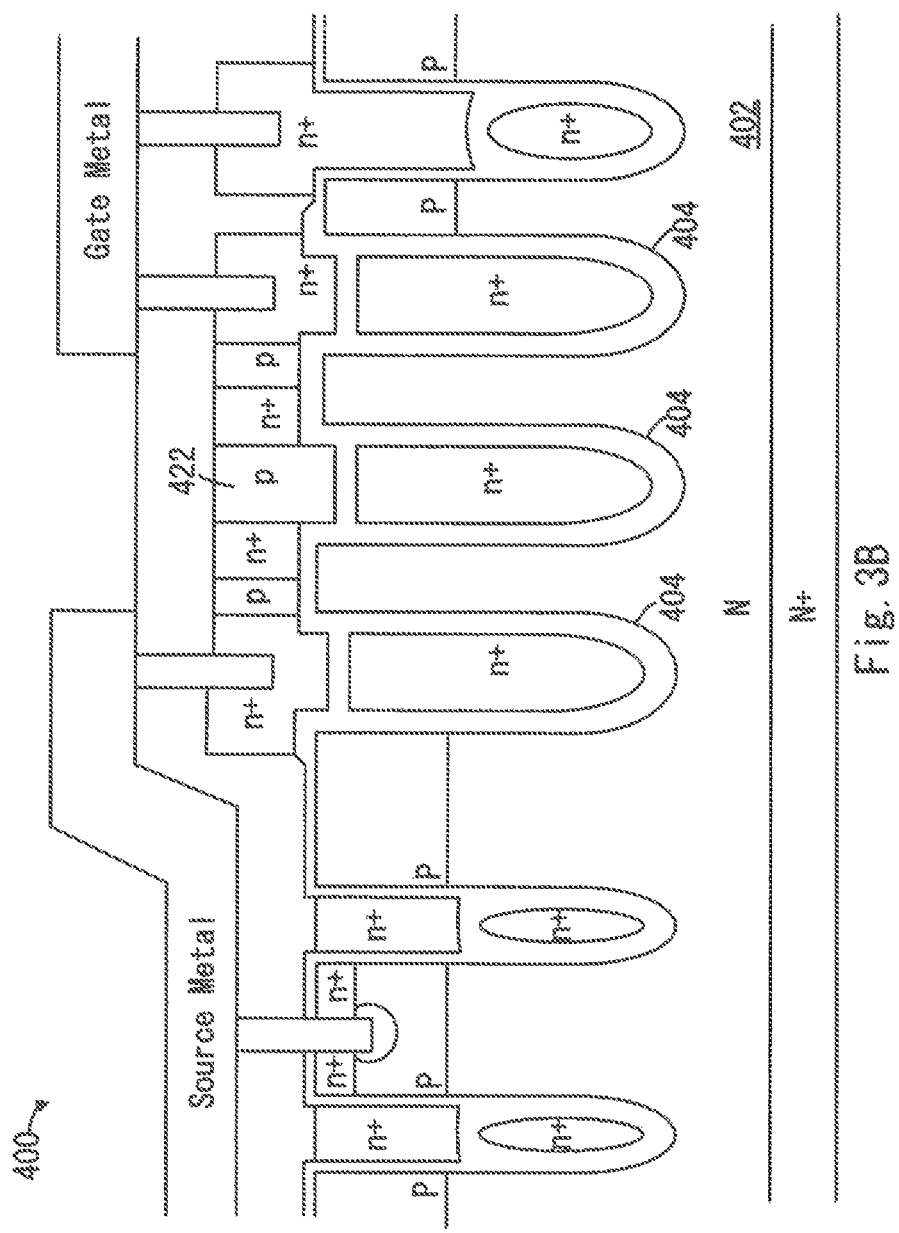

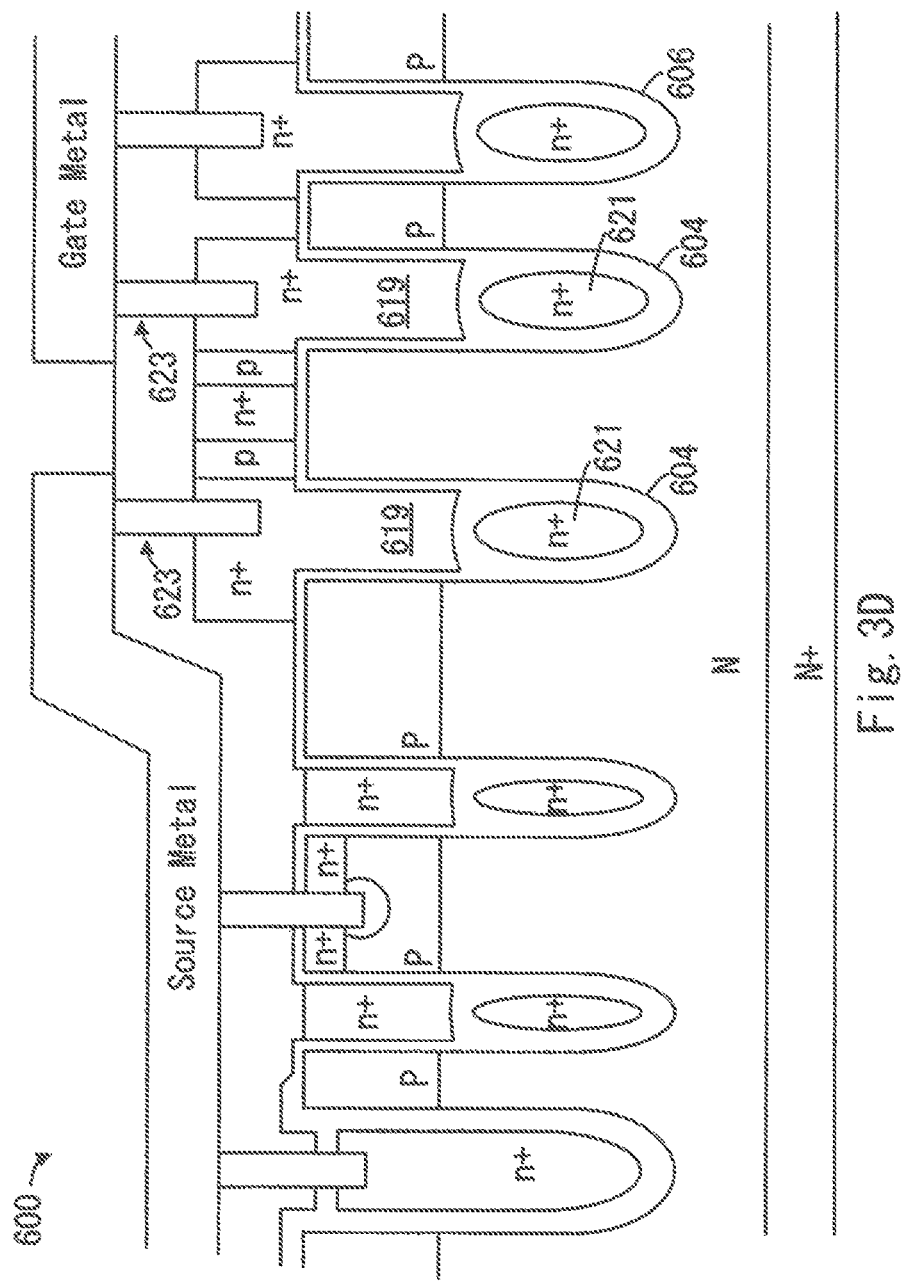

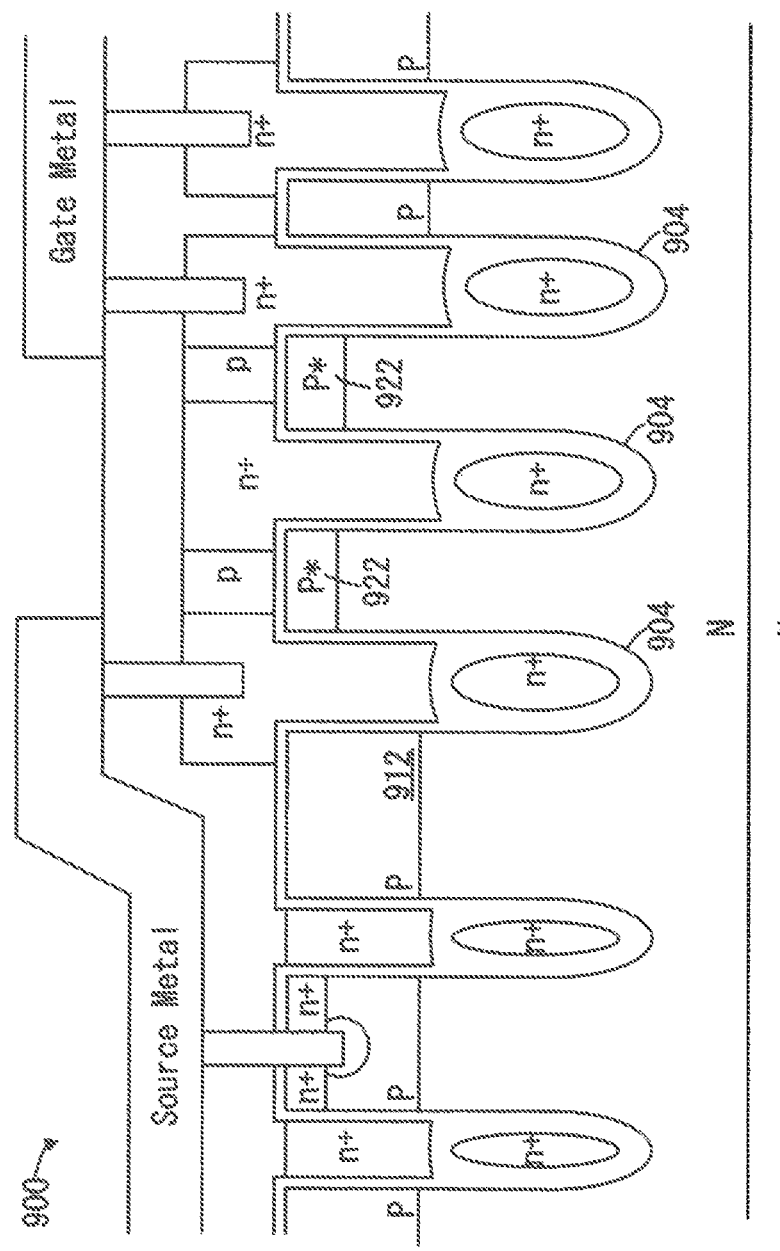

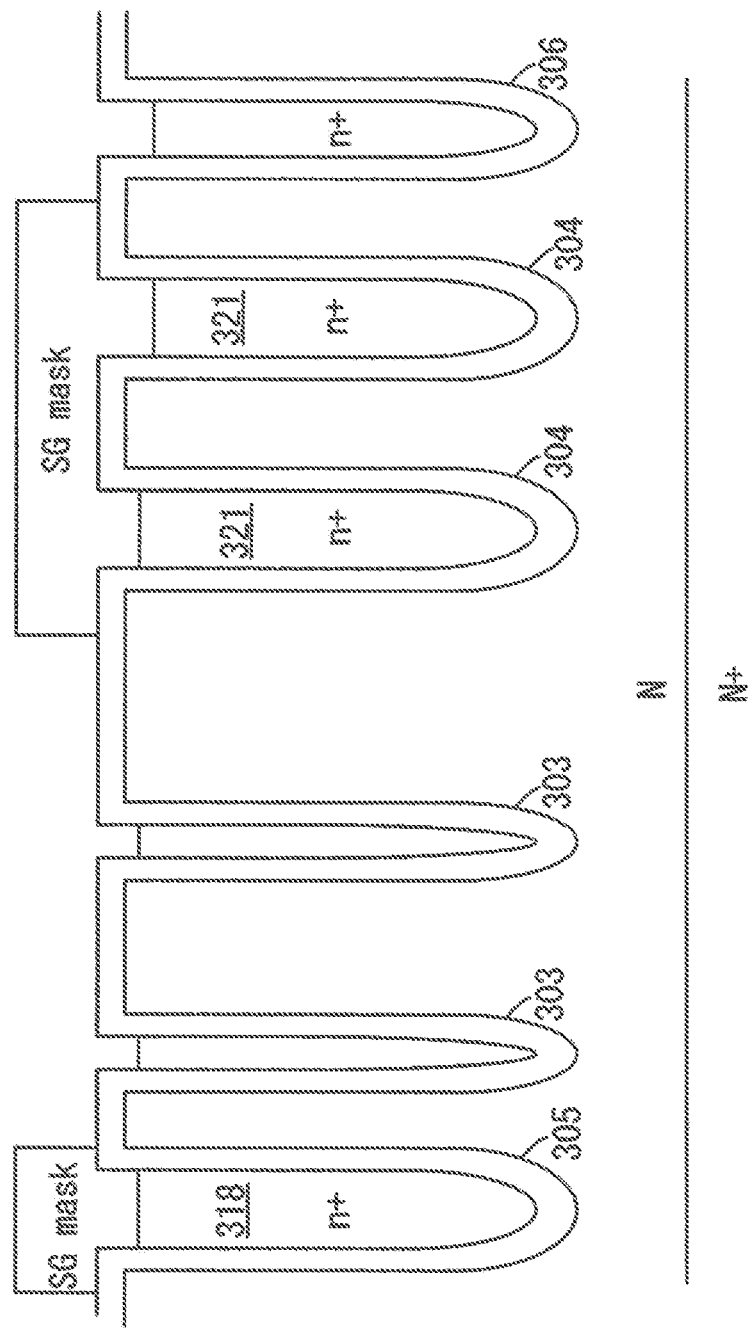

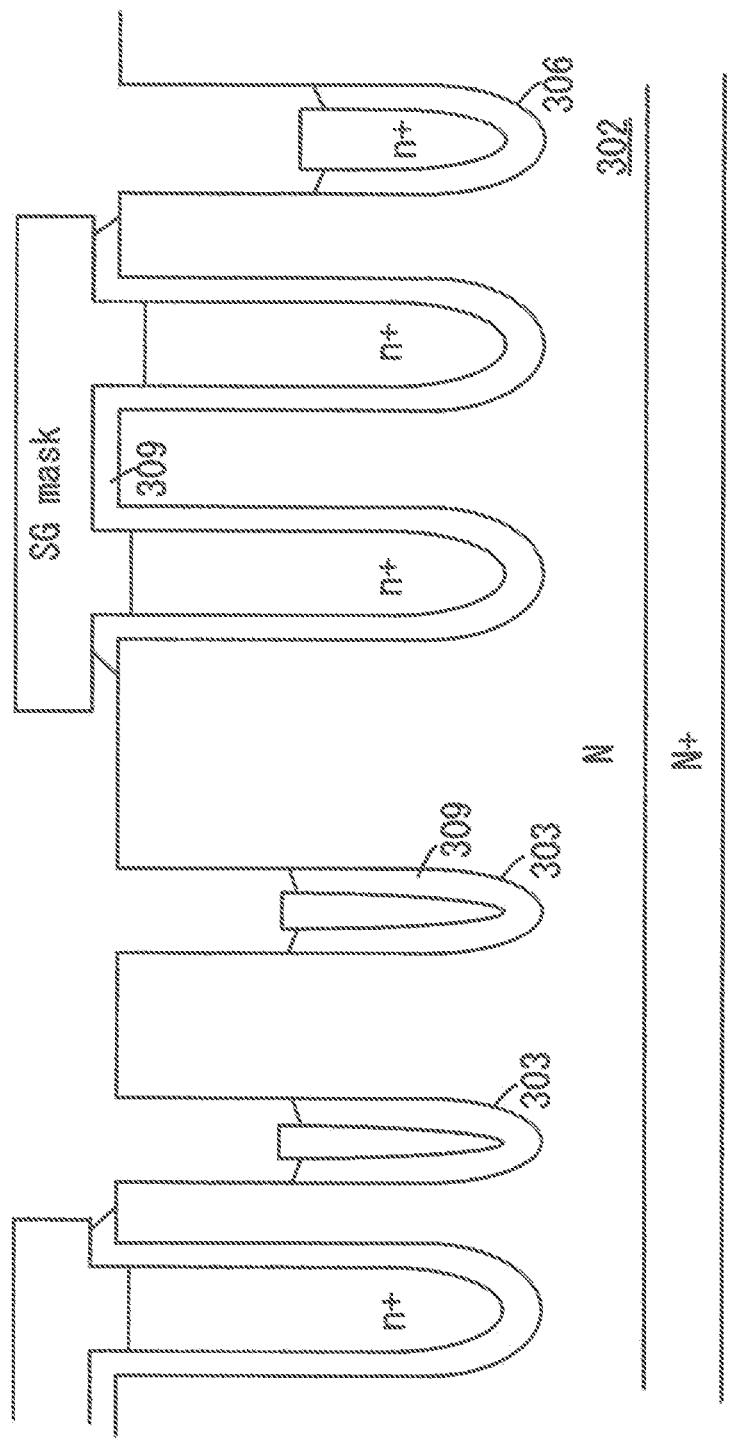

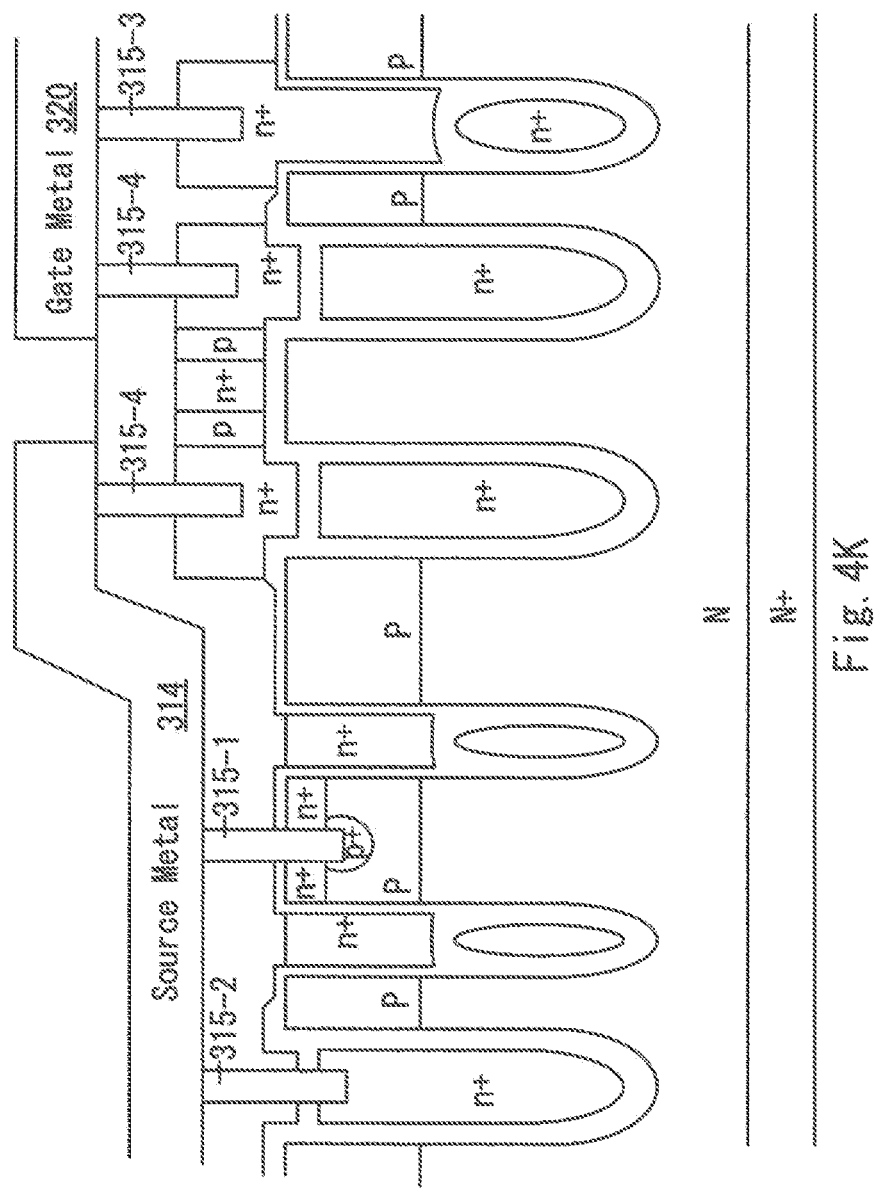

SHIELDED GATE TRENCH MOSFET WITH ESD DIODE MANUFACTURED USING TWO POLY-SILICON LAYERS PROCESS

FIELD OF THE INVENTION

This invention relates generally to semiconductor devices, and more particularly, to a shielded gate trench MOSFET (Metal Oxide Semiconductor Field Effect Transistor) with ESD diode and a manufacturing process using only two poly-silicon layers.

BACKGROUND OF THE INVENTION

Please refer to FIG. 1A for a shielded gate trench MOSFET (SGT) of prior art disclosed in U.S. Pat. No. 7,855,415. Compared to a conventional trench MOSFET having single trenched gate, a shielded gate trench MOSFET as shown in FIG. 1A is more attractive due to its reduced $C_{gd}$ (capacitance between gate and drain) in accordance with reduced $Q_{gd}$ (charge between gate and drain), and increased breakdown voltage of the trench MOSFET, making an excellent choice for power switching applications such as inverter and DC to DC power supply circuits. Moreover, the SGT has a shielded gate as a built-in RC snubber which is important for suppressing EMI (electromagnetic interface). Furthermore, in this prior art, an ESD (Electrostatic Discharge) protection diode is integrated with the SGT as shown in FIG. 1B for enhancing ESD capability.

However, the SGT MOSFET in FIG. 1B requires three poly-silicon layers (one poly-silicon layer for the shielded electrode, another for trenched gate and the other for ESD diode) and two mask layers for the shielded gate and the ESD diode, respectively, resulting in a complicated manufacture process and causing a high fabrication cost.

Please refer to FIG. 2 for another SGT with ESD diode of prior art disclosed in U.S. Pat. No. 9,963,969 which requires only two poly-silicon layers, because the poly-silicon layer used for shielded gate is also used for ESD diode, therefore, one poly-silicon layer is saved. Meanwhile, in the manufacturing process, the mask used to define shielded gate is also used to define the ESD diode, therefore, one mask is saved.

However, since the prior art has p type doped shielded gate (as shown in FIG. 2) resulting in high shielded gate resistance when shrinking device by reducing shielded gate width for lower on-resistance. The high shielded gate resistance will induce dynamic avalanching instability and more switching loss due to the shielded gate served as the snubber.

Therefore, there is still a need in the art of the semiconductor device design and fabrication, particularly for SGT trench MOSFET design and fabrication, to provide a novel cell structure, device configuration and manufacture process that making a SGT trench MOSFET having ESD diode and a simpler manufacture method to improve the performance of the trench MOSFET and to further cut down manufacturing cost.

SUMMARY OF THE INVENTION

The present invention provides a SGT trench MOSFET having an ESD clamp diode and requiring only two poly-silicon layers, moreover, the present invention has n type doped poly-silicon as the shielded gate which means the invented device can be shrunk with reducing shielded gate width for Rds reduction without increasing switching loss and having dynamic switching instability.

According to one aspect, the invention features a SGT trench MOSFET comprising: (a) an epitaxial layer of a first conductivity type extending over a substrate; (b) a plurality of first type trenches formed in said epitaxial layer in an active area, each of said first type trenches being filled with a shielded gate structure comprising a first poly-silicon layer in a lower portion to serve as a shielded electrode and a second poly-silicon layer in an upper portion to serve as a gate electrode, wherein the shielded electrode is insulated from the epitaxial layer by a first insulating film and the gate electrode is insulated from the epitaxial layer by a gate insulating film which has a thickness less than said first insulating film, wherein the shielded electrode and the gate electrode are insulated from each other by a second insulating film; (c) an ESD clamp diode comprising the second poly-silicon layer formed on top of the epitaxial layer and multiple second type trenches, wherein each of the second type trenches is filled with said first poly-silicon layer as a single electrode: (d) the ESD clamp diode being isolated from the epitaxial layer by the gate insulating film, and being isolated from the single electrode by said second insulating film, the single electrode being isolated from the epitaxial layer by the first insulating film; (e) the first and second poly-silicon layers being doped with the first conductivity type; and (f) anode or cathode trenched contacts of said ESD clamp diode being located above the multiple second trenches.

According to another aspect, the invention features a SGT trench MOSFET comprising: (a) an epitaxial layer of a first conductivity type extending over a substrate; (b) a plurality of first type trenches formed in the epitaxial layer in an active area, each of the first type trenches being filled with a shielded gate structure comprising a first poly-silicon layer in a lower portion to serve as a shielded electrode and a second poly-silicon layer in an upper portion to serve as a gate electrode, wherein the shielded electrode is insulated from the epitaxial layer by a first insulating film and the gate electrode is insulated from the epitaxial layer by a gate insulating film which has a thickness less than the first insulating film, wherein the shielded electrode and the gate electrode are insulated from each other by a second insulating film (c) an ESD clamp diode made of the second poly-silicon layer formed on top of the epitaxial layer and multiple second type trenches, wherein each of the second type trenches is filled with the first poly-silicon layer as a lower electrode and the second poly-silicon layer as an upper electrode, wherein the upper electrode is isolated from the lower electrode by the second insulating film; (d) the ESD clamp diode being isolated from the epitaxial layer by the gate insulating film, the lower electrode being isolated from the epitaxial layer by the first insulating film; (e) the first and second poly-silicon layers being doped with the first conductivity type; and (f) anode or cathode trenched contacts of the ESD clamp diode being located in the upper electrode.

According to another aspect of the present invention, preferred embodiments include one or more of the following features: the ESD clamp diode is consisted of at least one pair of back to back Zener diodes comprising multiple alternatively arranged doped regions of the first conductivity type and doped regions of a second conductivity type opposite to the first conductivity type; the active area further comprises source regions of the first conductivity type and body regions of the second conductivity type, wherein the source regions and the body regions are connected to a source metal through trenched source-body contacts filled with a contact metal plug which is tungsten metal layer padded by a barrier layer of Ti/TIN or Co/TiN or Ta/TiN: the shielded electrode is connected to an outlet part for the shielded electrode to further be shorted to the source metal through a trenched shielded electrode contact filled with the contact metal plug, wherein the outlet part for the shielded electrode is formed by the first poly-silicon layer in a third type trench; the gate electrode is connected to a wider gate electrode to further be shorted to a gate metal through a trenched gate contact filled with the contact metal plug, wherein the wider gate electrode is formed at a same step as the gate electrode in a fourth type trench having a greater trench width than the first type trenches.

Embodiments relate to a method of manufacturing a SGT MOSFET having a ESD clamp diode comprising: growing an epitaxial layer of a first conductivity type onto a substrate of the first conductivity type, wherein the epitaxial layer has a lower doping concentration than the substrate; forming a plurality of trenches inside the epitaxial layer, including a plurality of first type trenches in an active area and multiple second type trenches underneath the ESD clamp diode; depositing a doped first poly-silicon layer to fill all the trenches, padded by a first insulating film: performing poly CMP, making the first poly-silicon layer remained within all the trenches to serve as single electrodes in the second type trenches; performing poly-silicon etching and oxide etching, leaving necessary part of the first poly-silicon layer in the first type trenches to serve as shielded electrodes; growing a gate insulating film; depositing an un-doped second poly-silicon layer covering top of the device and filling the first type trenches onto the gate insulating layer: performing ion implantation of the second conductivity type dopant; forming a thermal oxide layer and a nitride layer successively onto the second poly-silicon layer: applying a poly mask, performing dry nitride etch and ion implantation of the first conductivity type dopant; driving-in the dopant of the first conductivity type; etching away some of the second poly-silicon layer to expose the area for following body ion implantation of the second conductivity type, leaving necessary part of the second poly-silicon layer to serve as gate electrodes in the first type trenches and for formation of the ESD clamp diode onto the second type trenches; removing the nitride layer and driving-in the dopant in the body region; applying a mask and performing ion implantation of the first conductivity type dopant to form source region and anode (cathode) regions for ESD clamp diode.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The accompanying drawings, which are included to provide a further understanding of the invention and are incorporated in and constitute a part of this specification, illustrate exemplary embodiments of the invention and together with the description serve to explain the principles of the invention. In the drawings:

FIG. 3B is a cross-sectional view of another preferred embodiment according to the present invention.

FIG. 3D is a cross-sectional view of another preferred embodiment according to the present invention.

FIG. 3G is a cross-sectional view of another preferred embodiment according to the present invention.

DETAILED DESCRIPTION OF THE EMBODIMENTS

In the following Detailed Description, reference is made to the accompanying drawings, which forms a part thereof, and in which is shown by way of illustration specific embodiments in which the invention may be practiced. In this regard, directional terminology, such as "top", "bottom", "front" "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1A:
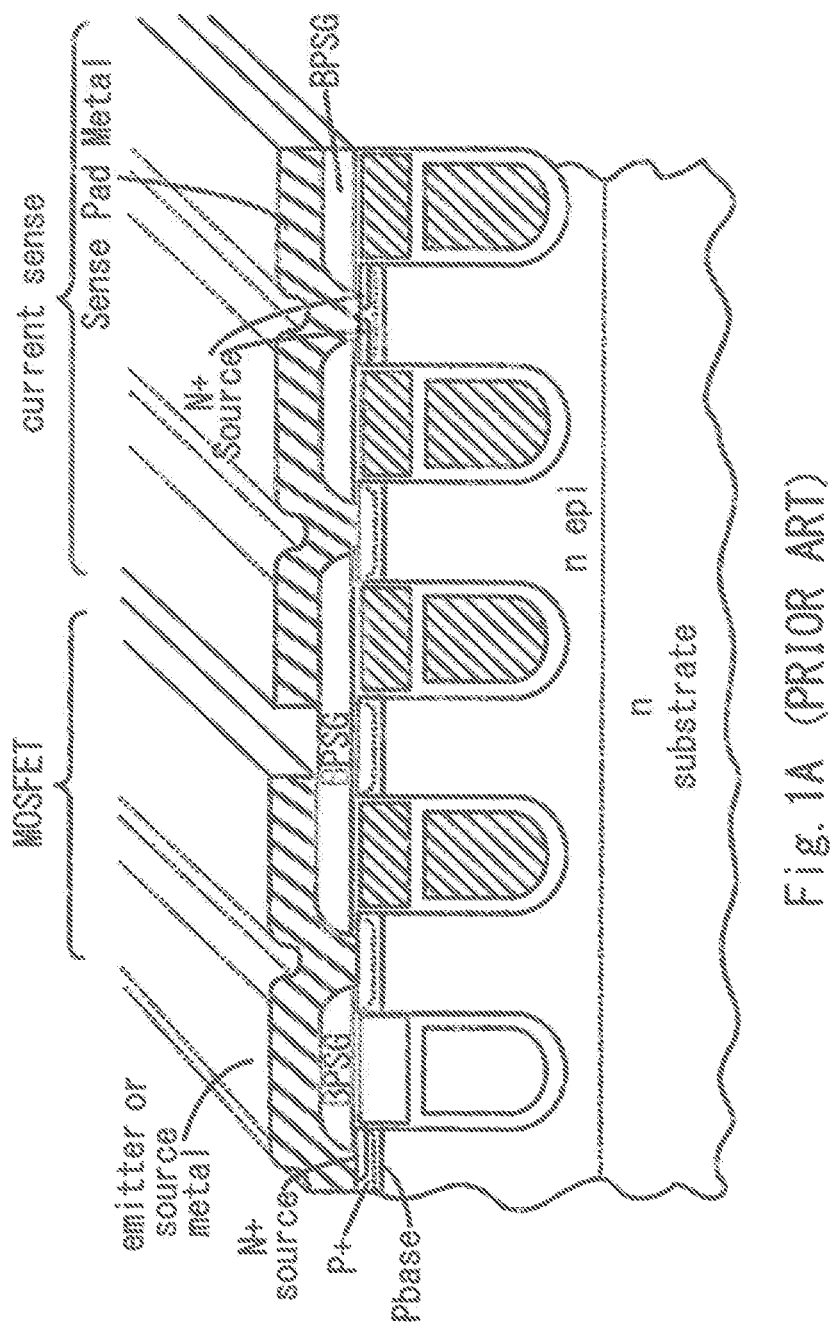
FIG. 1A is a cross-sectional view of a SGT MOSFET of prior art.
Figure 1B:
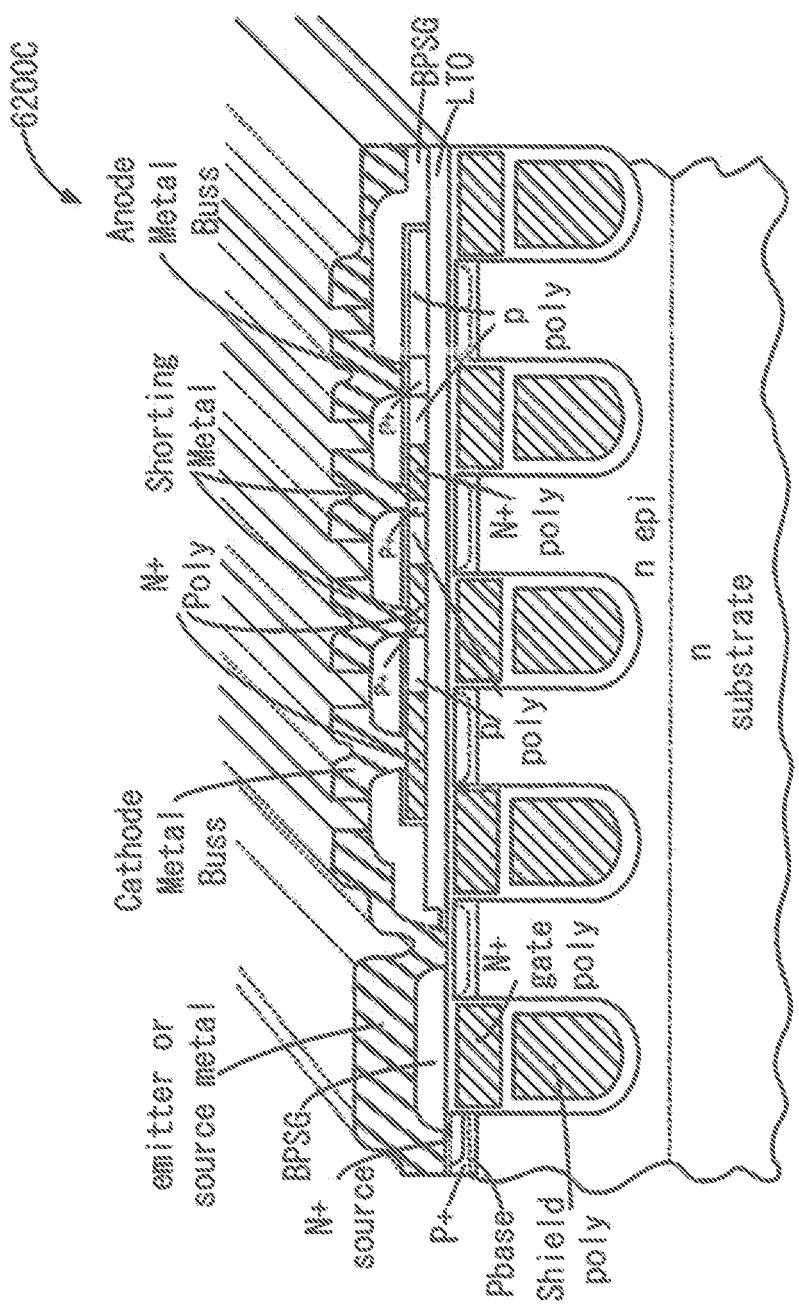
FIG. 1B is a cross-sectional view of a SGT MOSFET having an ESD protection diode of prior art.
Figure 2:
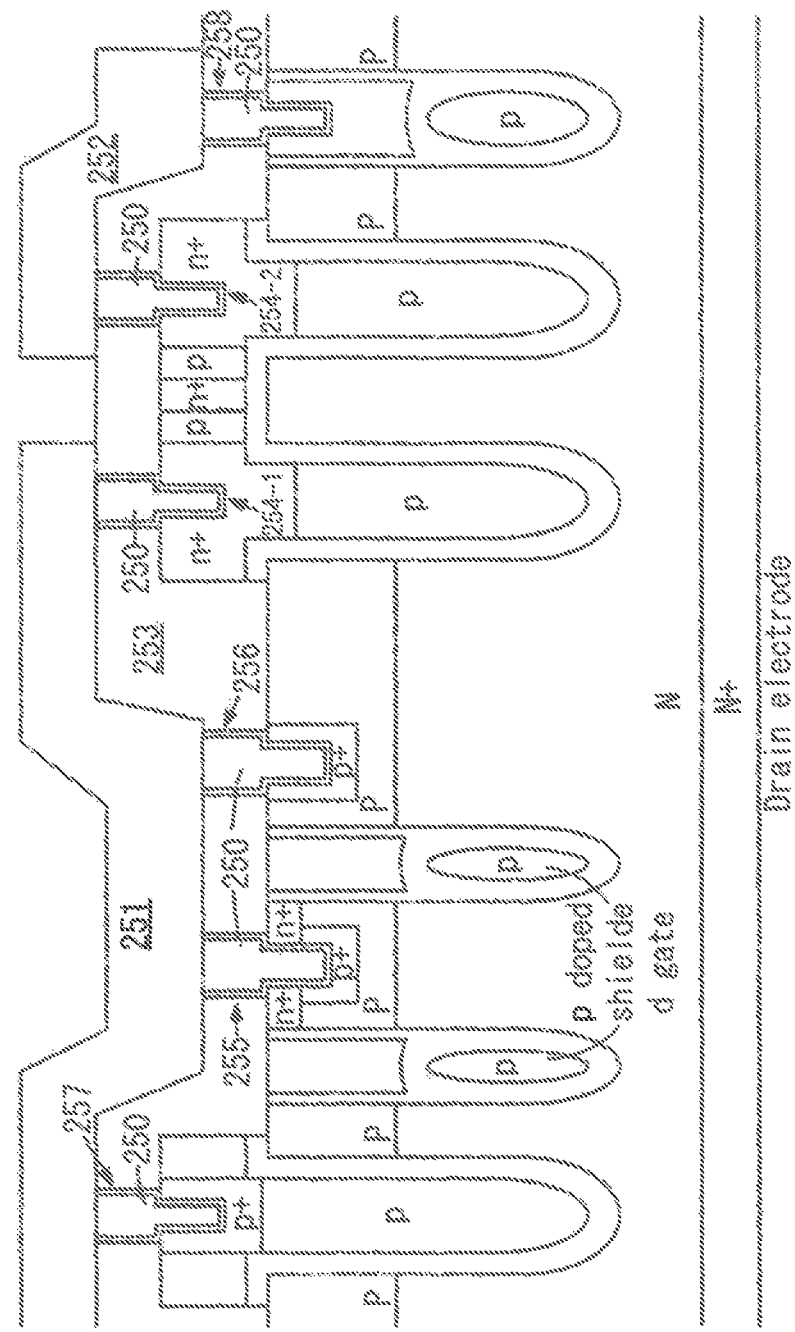
FIG. 2 is a cross-sectional view of a SGT MOSFET having an ESD diode of another prior art.
Figure 3A:
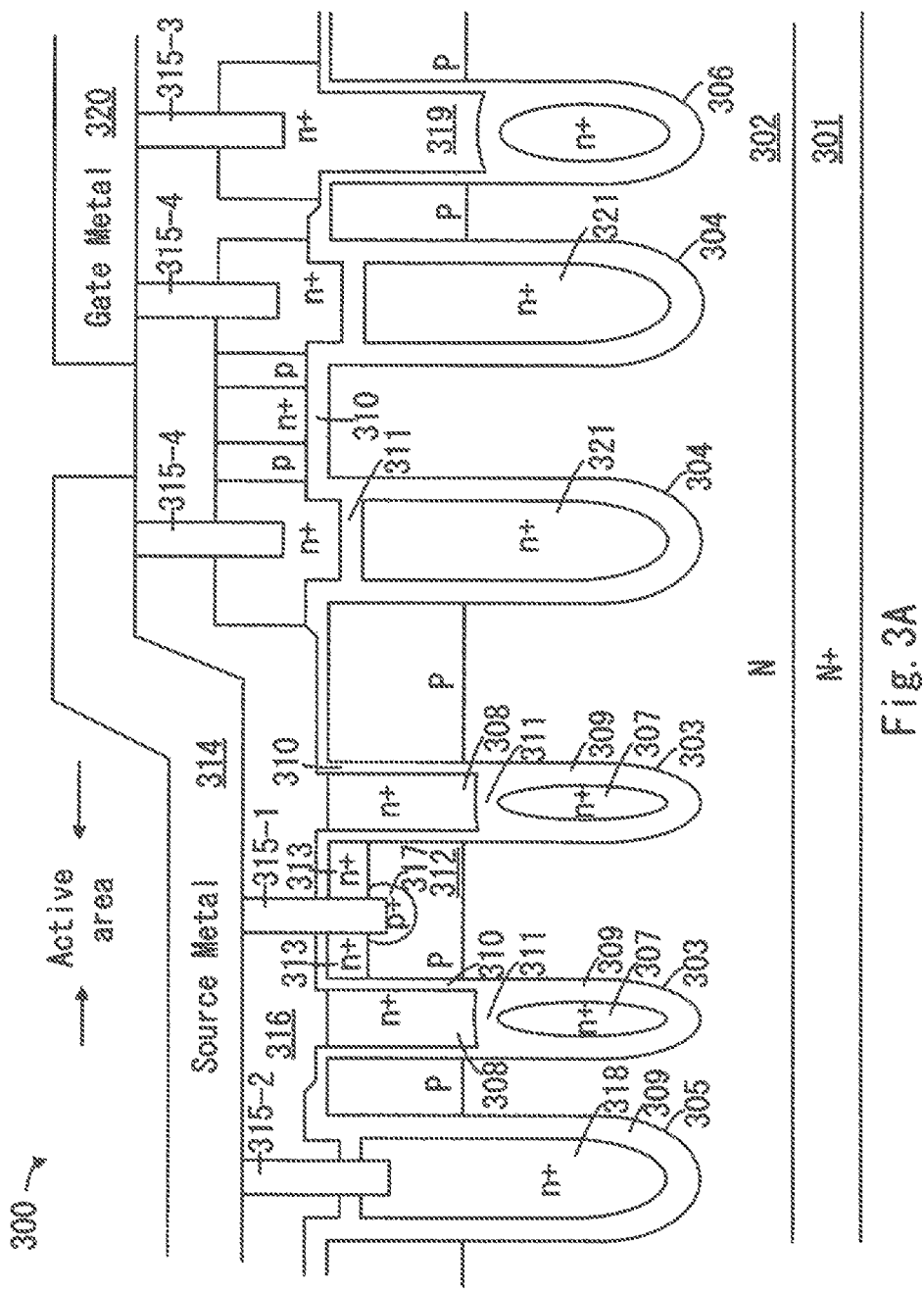
FIG. 3A is a cross-sectional view of a preferred embodiment according to the present invention.

Please refer to FIG. 3A for a preferred embodiment of this invention wherein an N-channel SGT MOSFET 300 with an ESD clamp diode is formed on an N+ substrate 301 with an N epitaxial layer 302 extending whereon. Inside the N epitaxial layer 302 forms: a plurality of first type trenches 303 in an active area (as illustrated): multiple second type trenches 304 underneath the ESD clamp diode (there are two second type trenches in this embodiment): a third type trench 305 used for shielded gate connection and a fourth type trench 306 used for gate connection. Each of the first type trenches 303 is filled with a shielded gate structure comprising: a first poly-silicon layer in a lower portion to serve as a shielded electrode 307 of n doped type; and a second poly-silicon layer in an upper portion to serve as a gate electrode 308 of n doped type; the shielded electrode 307 is insulated from the N epitaxial layer 302 by a first insulating film 309, the gate electrode 308 is insulated from the N epitaxial layer 302 by a gate insulating film 310 which has a thickness less than the first insulating film 309, wherein the shielded electrode 307 and the gate electrode 308 are insulated from each other by a second insulating film 311. The active area further comprises P body regions 312 and n+ source regions 313 extending whereon between two adjacent gate electrodes 308, wherein the n+ source regions 313 and the P body regions 312 are connected to a source metal 314 through trenched source-body contacts with each filled with a contact metal 315-1 which penetrates through a contact interlayer 316, the n+ source regions 313 and extends into a p+ body contact area 317 in the P body region 312 which also extends between two adjacent of other trenches except between two adjacent of the second type trenches 304. The shielded electrodes 307 in the active area are connected to an outlet part 318 of n doped type for the shielded electrodes 307 to further be shorted to the source metal 314 through a trenched shielded electrode contact filled with a contact metal plug 315-2, wherein the outlet part 318 for the shielded electrodes 307 is formed by the first poly-silicon layer in the third type trench 305 and is insulated from the N epitaxial layer 302 by the first insulating film 309. The gate electrodes 308 in the active area are connected to a wider gate electrode 319 of n doped type to further be shorted to a gate metal 320 through a trenched gate contact filled with a contact metal plug 315-3, wherein the wider gate electrode 319 is formed at a same step as the gate electrodes 308 in the first type trenches 303. The ESD clamp diode is formed on top surface of the N epitaxial layer 302 and above two second type trenches 304, wherein each of the second type trenches 304 is filled with the first poly-silicon layer as a single electrode 321 of n doped type. The ESD clamp diode is constituted of at least one pair of back to back Zener diodes comprising multiple alternatively arranged doped regions of n+/p/n+/p/n+, and furthermore, the ESD diodes is formed by the second poly-silicon layer and is isolated from the N epitaxial layer 302 by the gate insulating film 310 while from the single electrode 321 by the second insulating film 311. In the ESD clamp diode, n+ anode regions on two ends are respectively shorted to the source metal 314 and the gate metal 320 by trenched anode contacts each located right above the second type trenches 304, and the trenched anode contacts are filled with contact metal plugs 315-4. All the contact metal plugs (315-1, 315-2, 315-3 and 315-4) can be implemented by using tungsten metal layer padded by a barrier layer of Ti/TiN or Co/TiN or Ta/TiN.

FIG. 3B shows another preferred embodiment of the present invention, wherein an N-channel SGT MOSFET 400 as illustrated has a similar device structure to FIG. 3A, except that, in FIG. 3B, there are at least three third type trenches 404 underneath the ESD clamp diode in the N epitaxial layer 402.

Figure 3C:
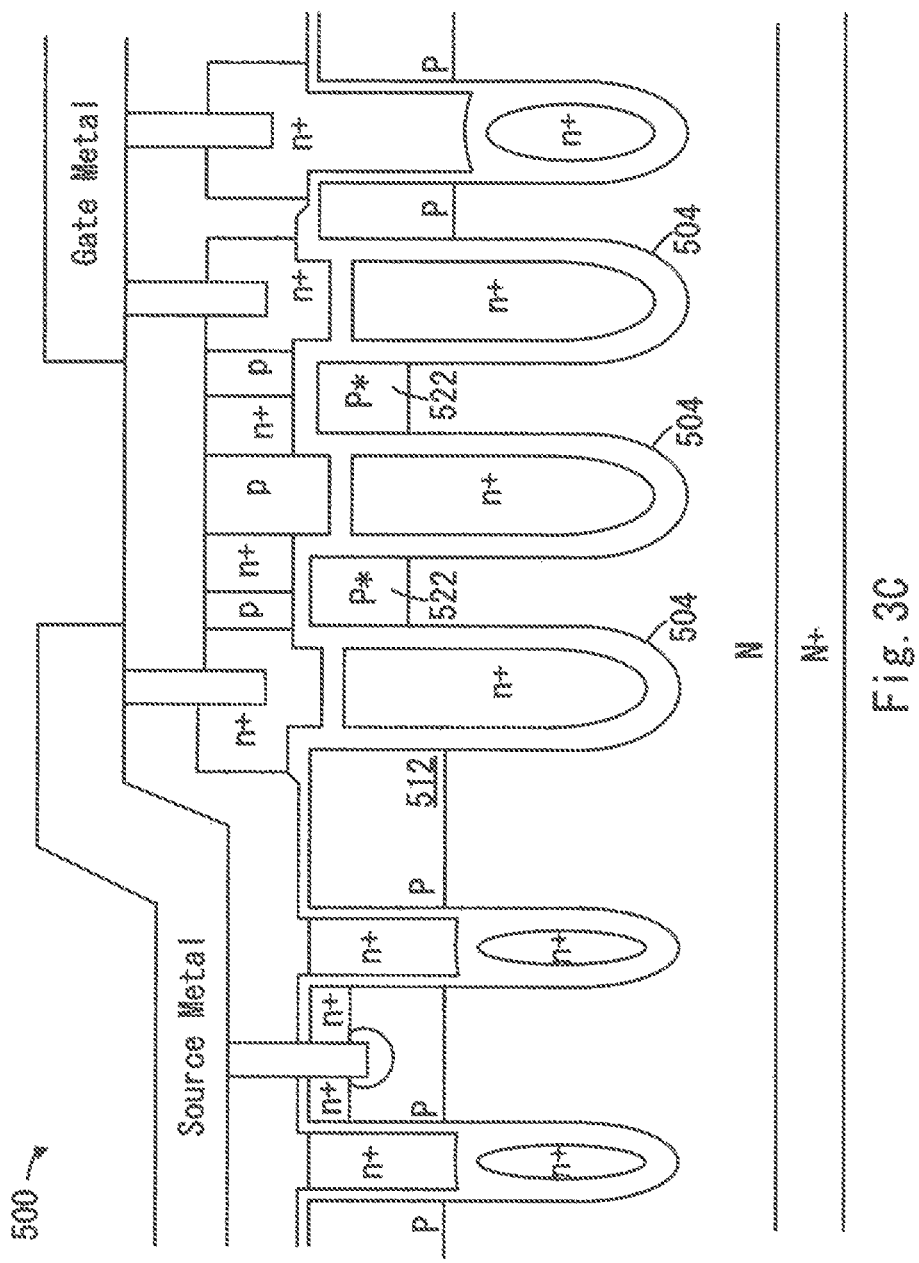
FIG. 3C is a cross-sectional view of another preferred embodiment according to the present invention.

FIG. 3C shows another preferred embodiment of the present invention, wherein an N-channel SGT MOSFET 500 as illustrated has a similar device structure to FIG. 3B, except that, in FIG. 3C, a P* regions 522 with less doped concentration and shallower junction depth than the P body regions 512 are formed between every two adjacent of the second type trenches 504 underneath the ESD clamp diode to avoid early breakdown issue.

FIG. 3D shows another preferred embodiment of the present invention, wherein an N-channel SGT MOSFET 600 as illustrated has a similar device structure to FIG. 3A, except that, in FIG. 3D, the second type trenches 604 are filled with the shielded gate structure which is the same as in the fourth type trench 606 instead of the single electrode structure in FIG. 3A. Onto a lower electrode 621 in the second type trenches 604, an upper electrode 619 of n doped type is also serving as n+ anodes on two ends of the ESD clamp diode. Accordingly, the trenched anode contacts 623 are extending into the gate electrodes 619.

Figure 3E:
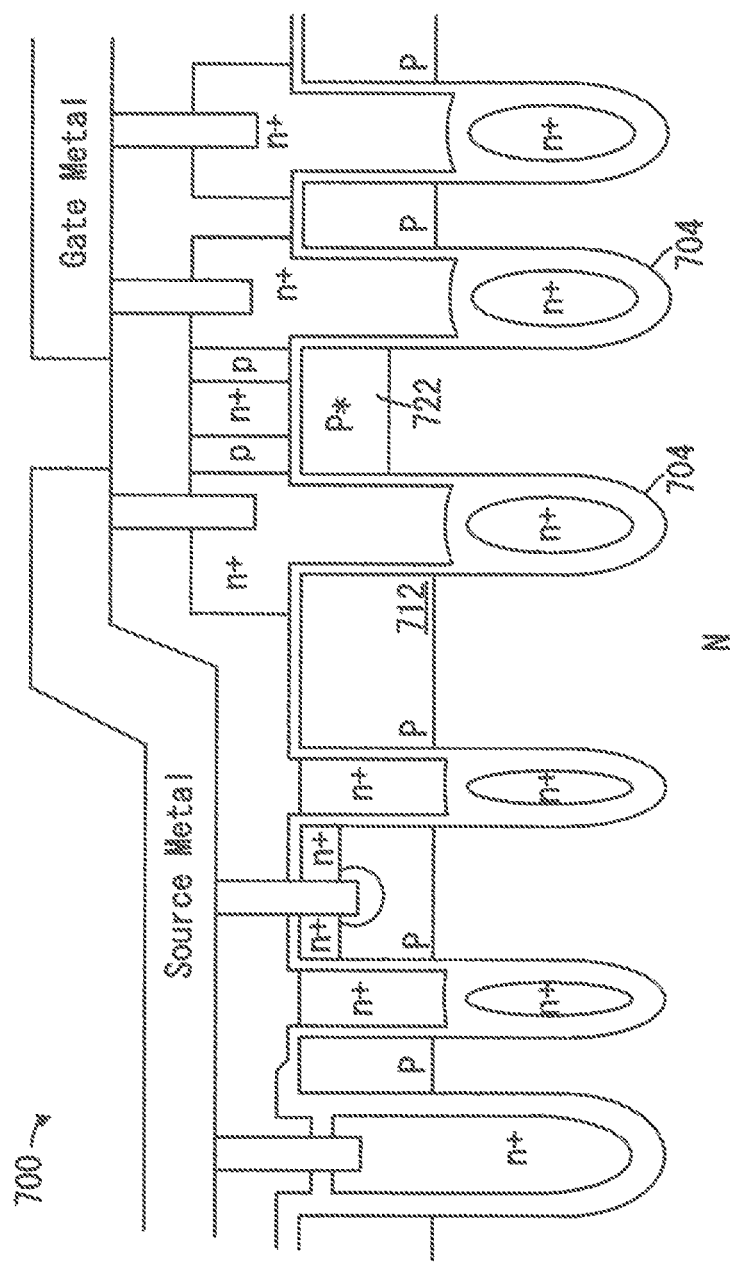
FIG. 3E is a cross-sectional view of another preferred embodiment according to the present invention.

FIG. 3E shows another preferred embodiment of the present invention, wherein an N-channel SGT MOSFET 700 as illustrated has a similar device structure to FIG. 3D, except that, in FIG. 3E, a P* region 722 with less doped concentration and shallower junction depth than the P body regions 712 are formed between the two adjacent second type trenches 704 underneath the ESD clamp diode to avoid early breakdown voltage.

Figure 3F:
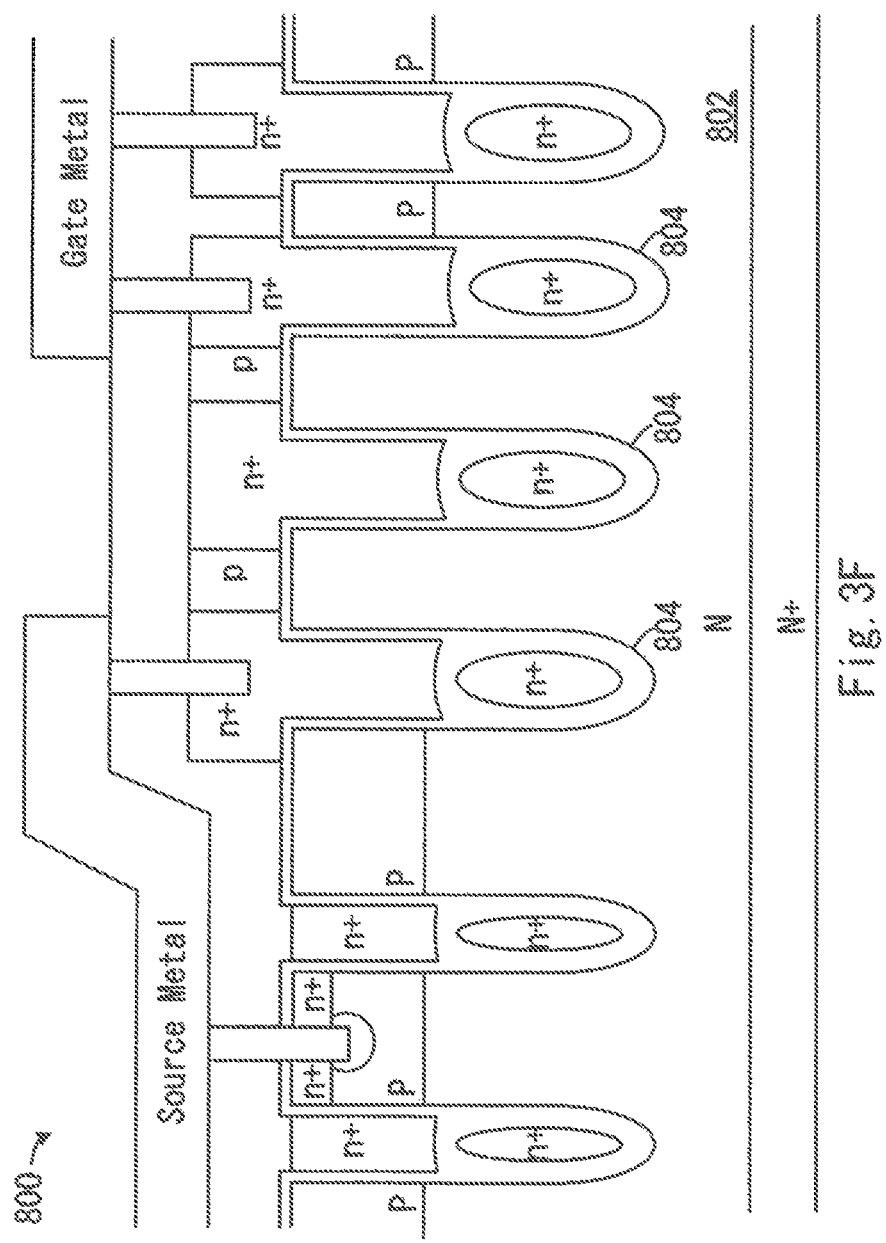
FIG. 3F is a cross-sectional view of another preferred embodiment according to the present invention.

FIG. 3F shows another preferred embodiment of the present invention, wherein an N-channel SGT MOSFET 800 as illustrated has a similar device structure to FIG. 3D, except that, in FIG. 3F, there are at least three third type trenches 804 underneath the ESD clamp diode in the N epitaxial layer 802.

FIG. 3G shows another preferred embodiment of the present invention, wherein an N-channel SGT MOSFET 900 as illustrated has a similar device structure to FIG. 3F, except that, in FIG. 3C a P* region 922 with less doped concentration and shallower junction depth than the P body regions 912 are formed between every two adjacent of the second type trenches 904 underneath the ESD clamp diode to avoid early breakdown voltage.

Figure 4A:
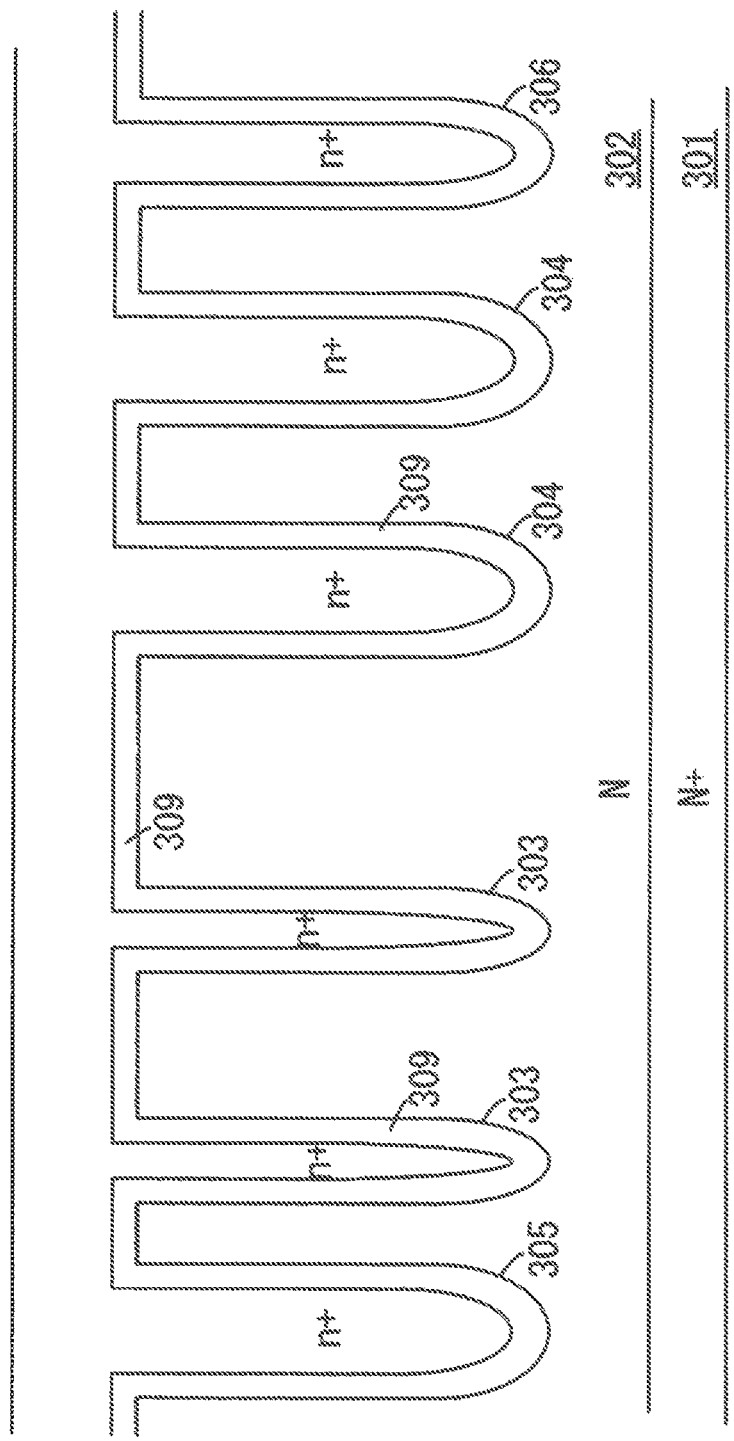
FIGS. 4A-4K are a serial of cross-sectional views illustrating the process for fabricating the SGT MOSFET in FIG. 3A.
Figure 4O:
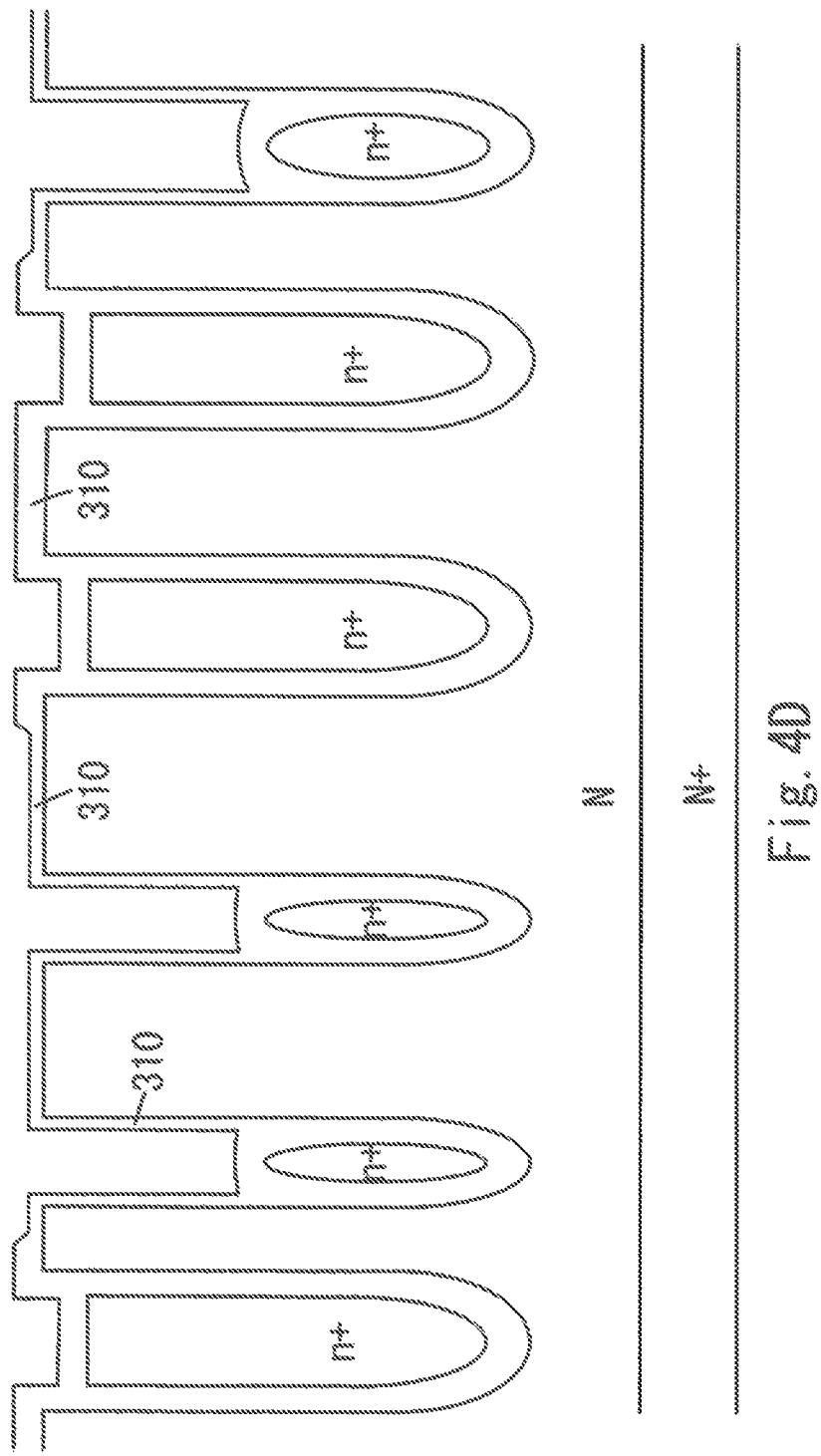

FIGS. 4A-4K are cross-sectional views illustrating the process for fabricating the N-channel SGT MOSFET 300 in FIG. 3A. In FIG. 4A, the process begins with an N epitaxial layer 302 grown on a heavily doped N+ substrate 301. After offering a trench mask onto the N epitaxial layer 302, a plurality of trenches are formed by a lithographic and an etching step, including a plurality of first type trenches 303, multiple second type trenches 304, a third type trench 305 and a fourth type trench 306. Afterward, a first insulating film 309 is formed lining top surface of the N epitaxial layer 302 and inner surface of all the trenches. Then, a first poly-silicon layer of n doped is deposited over the first insulting film 309 to fill all the trenches.

In FIG. 4B, after poly CMP (Chemical and Mechanical Polish), the first poly-silicon layer is remained within all the trenches, forming single electrodes 321 in the second type trenches 304 and an outer part 318 for the shielded gate in the third type trench 305. Then, a SG (Shielded Gate) mask is applied to define areas for shielded gates structure, including the first type trenches 303 in active area and the fourth type trench 306 for gate connection.

In FIG. 4C, after steps of oxide etching and dry poly-silicon etching, the first insulating film 309 and the exposed first poly-silicon layer are selectively removed from partial top surface of the N epitaxial layer 302, and from upper portion of the first type trenches 303 and the fourth type trench 306.

In FIG. 4D, after removing the SG mask, another oxide layer is formed lining exposed surface of the device to serve as a gate insulating film 310.

Figure 4E:
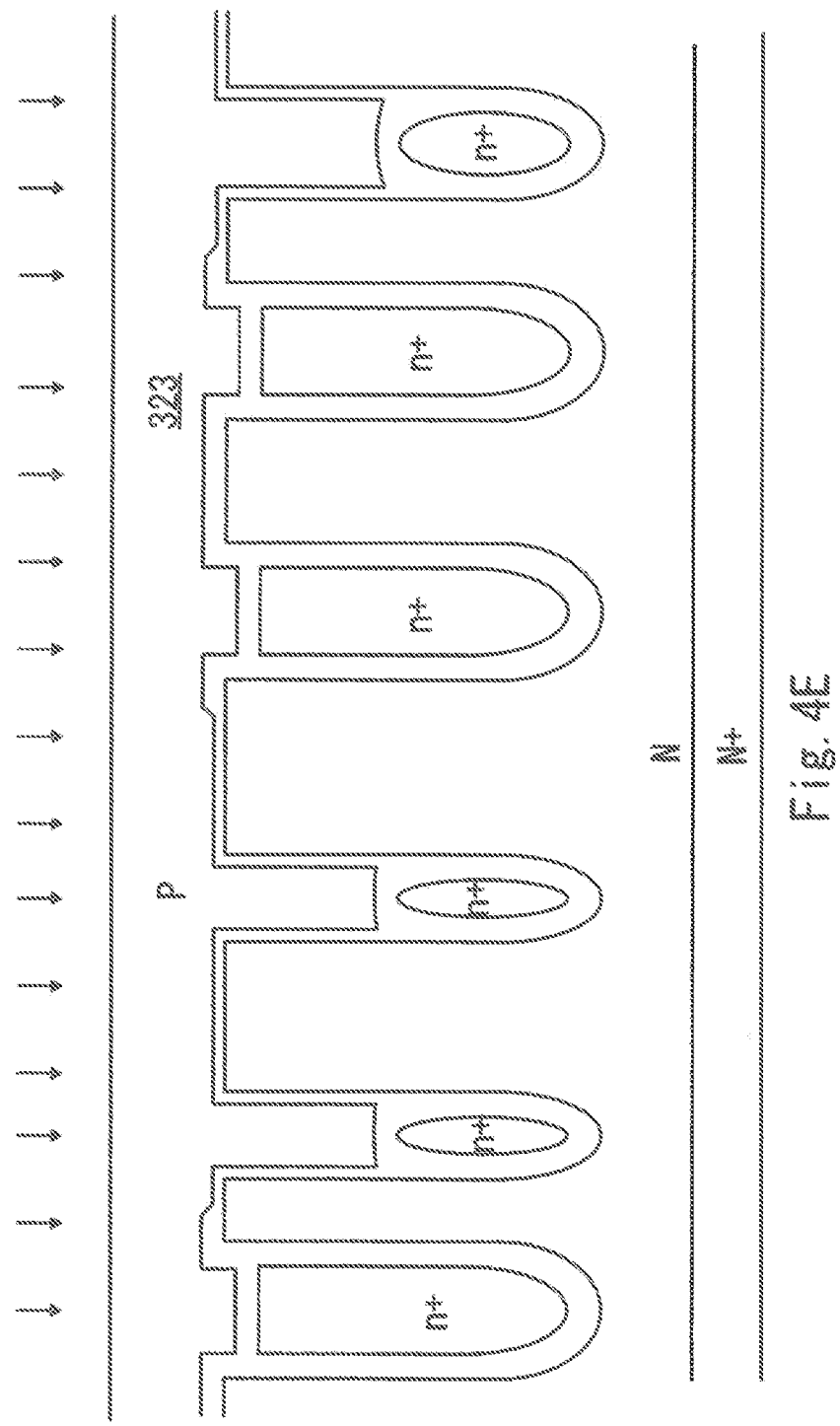

In FIG. 4E, an un-doped second poly-silicon layer 323 is deposited filing the first and fourth type trenches and over the entire surface of the device, followed by successive steps of blank Boron ion implantation to make the second poly-silicon layer 323 be doped with P type dopant.

Figure 4F:
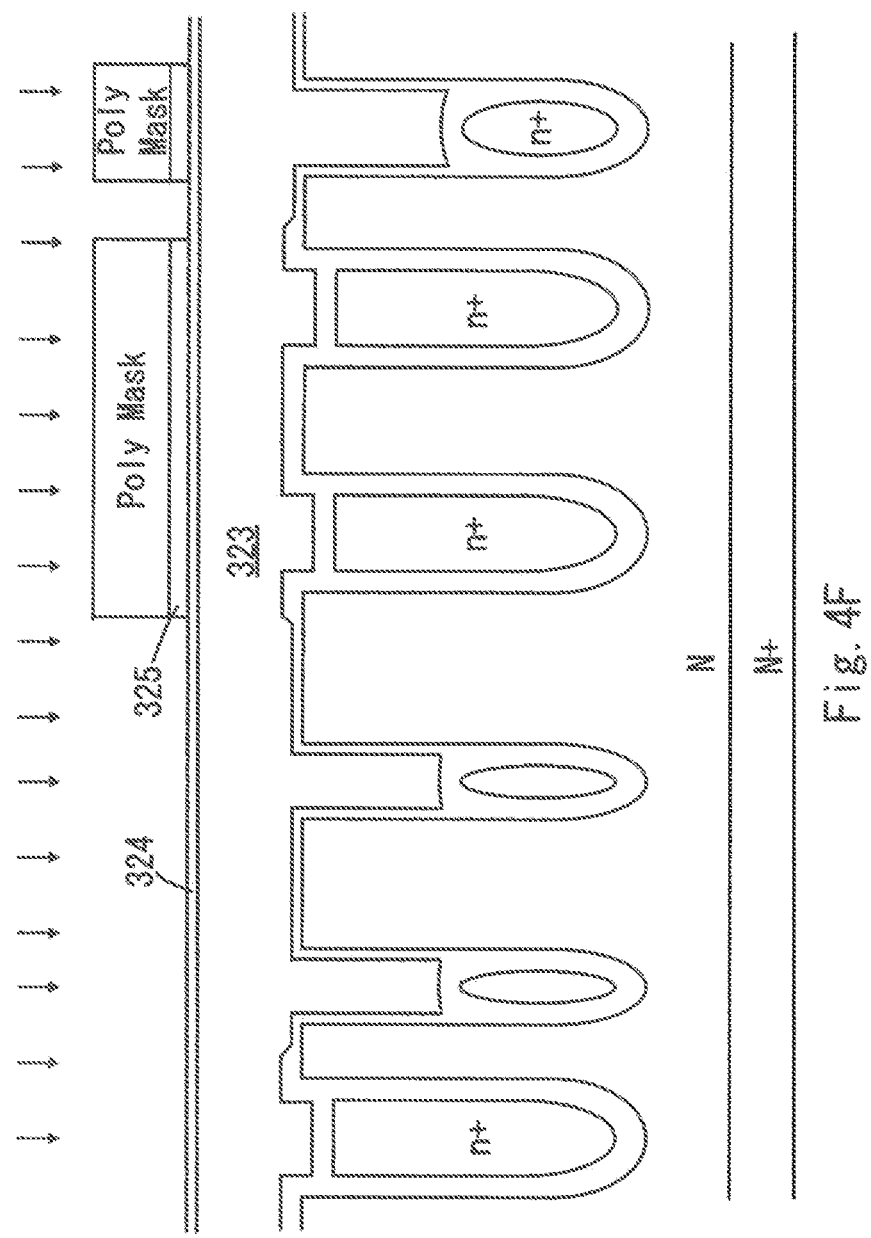

In FIG. 4F, a thermal oxide layer 324 having thickness about 100 A is formed onto the second poly-silicon layer 323. After that, a Nitride layer 325 having thickness about 2000~3000 A is deposited onto the thermal oxide layer 324, and is then dry etched after applying a poly mask. Then, a Phosphorus ion implantation is performed to make the second poly-silicon layer 323 be doped with N type dopant.

Figure 4G:
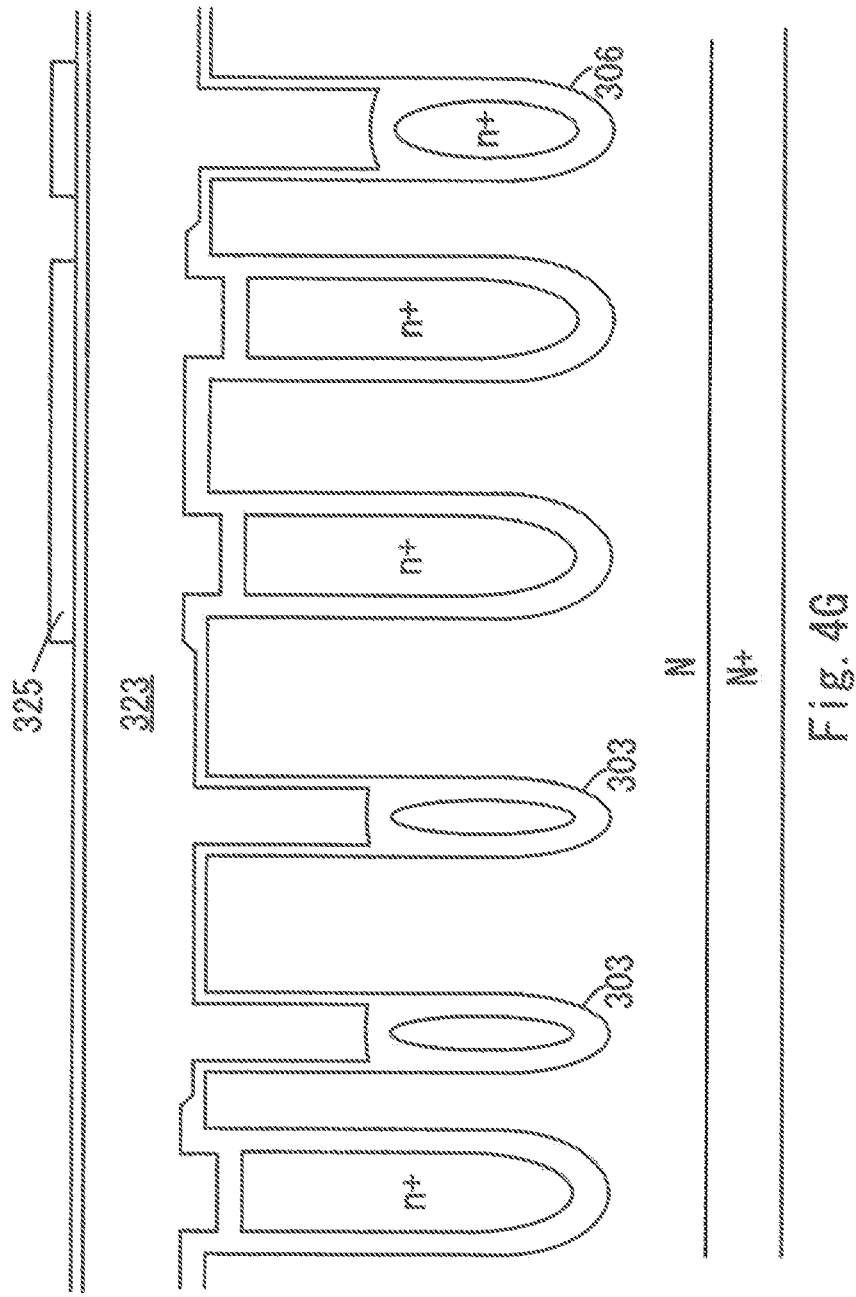

In FIG. 4G the poly mask is removed and a step of Phosphorus driving-in is performed to make the n type dopant further diffuse into the second poly-silicon layer 323. In the driving-in step, the Phosphorus driving-in helps to make the n type dopant further diffuse into the portion of the second poly-silicon layer 323 respectively in the upper portion of the first and fourth type trenches 303 and 306 where the nitride layer 325 doesn't exist whereon.

Figure 4H:
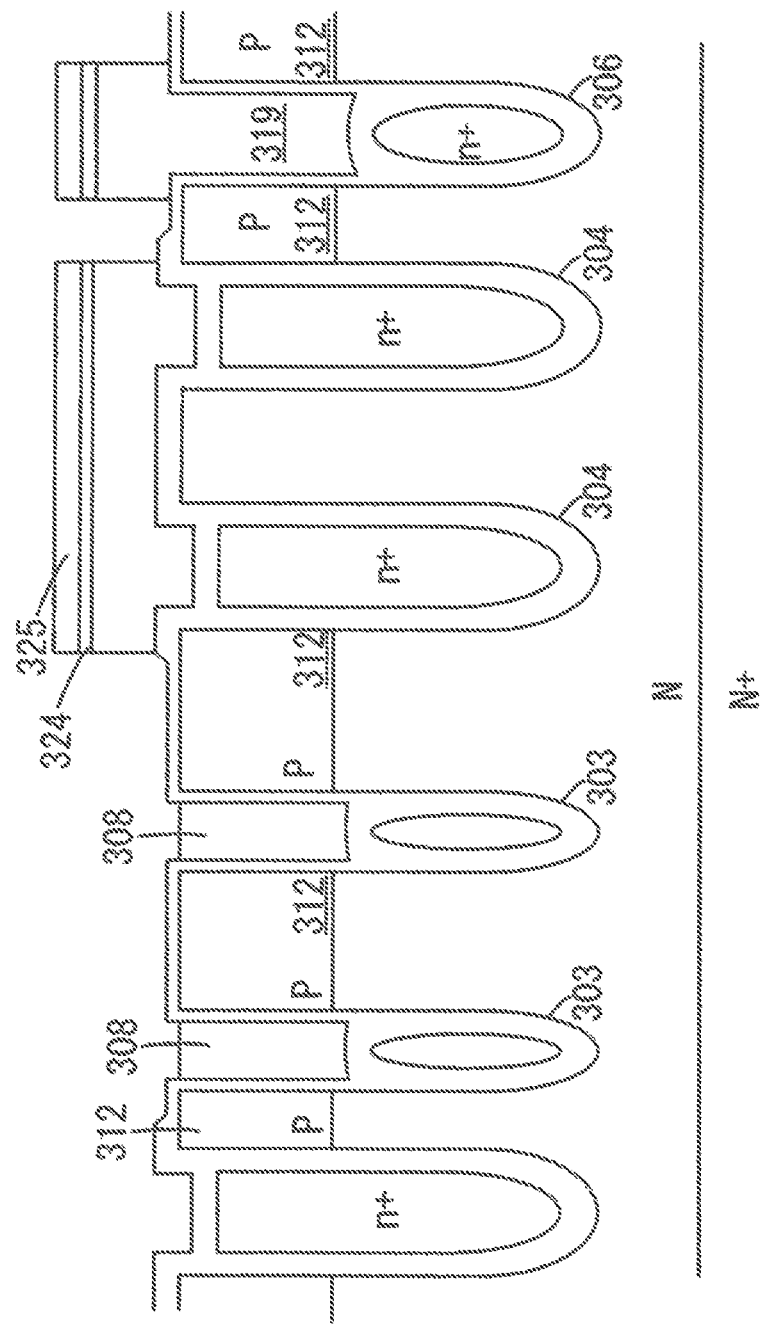
Figure 41:
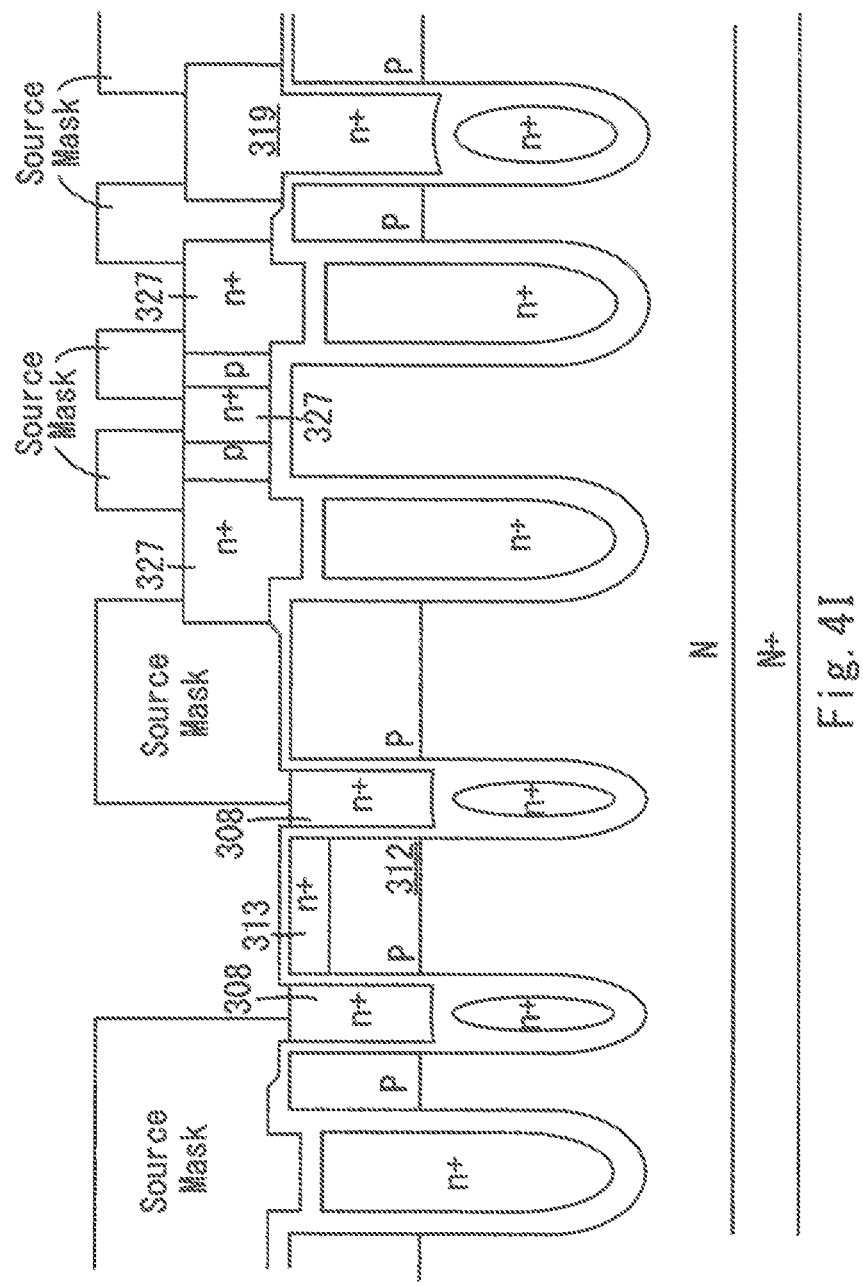

In FIG. 4H, the thermal oxide layer 324 is first removed by definition of the Nitride layer 325, following by a step of poly etch to make the second poly-silicon layer left: within the upper portion of the first type trenches 303 to serve as gate electrodes of the shielded gate structure; within and protruding out of the fourth type trench 306 to serve as a wider gate electrode 319 for gate connection; covering top of the second type trenches 304 for formation of ESD clamp diode. Next, another Boron ion implantation is performed to form P body region 312 between two adjacent of all the trenches except the second type trenches 304. Then, after the oxide layer 326 and the nitride layer 325 are removed away, a step of P body dopant driving-in is performed.

In FIG. 4I, after applying a source mask, a source ion implantation with n type dopant is performed to: form source regions 313 on top of the P body region 312 in the active are; form n+ anode regions 327 for the ESD clamp diode: and make the gate electrode 319 be of n type doped.

Figure 4J:
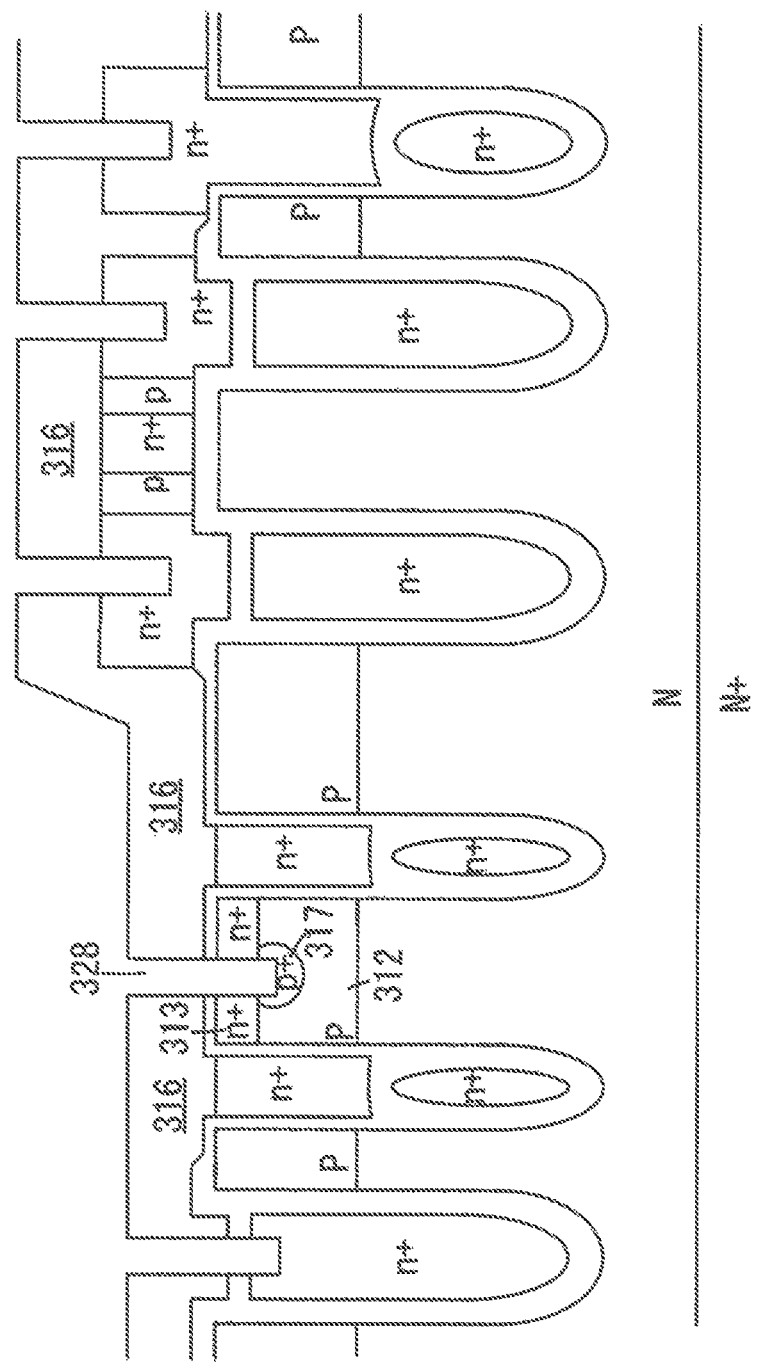

In FIG. 4J, after removing the source mask, a contact interlayer 316 is deposited along top surface of the device. Then, after applying a contact mask (not shown) onto the contact interlayer 316, a plurality of contact trenches are formed by performing successive dry oxide etching and dry silicon etching. After that, a BF2 ion implantation is performed to form the p+ contact area 317 in the P body region 312 and surrounding at least bottom of the contact trench 328 through the n+ regions 313.

In FIG. 4K, a barrier layer of Ti/TiN (or Ta/Ti or Co/TiN, not shown) is deposited along inner surface of all the contact trenches, then a tungsten metal layer is deposited onto the barrier layer and then etched back to serve as contact metal plugs 315-1~315-4 respectively for the formation of trenched source-body contact, trenched shielded electrode contact, trenched gate contact and trenched anode contacts. Next, a front metal is deposited covering front surface of the device and is then etched to form source metal 314 and gate metal 320 by definition of a metal mask.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A SGT MOSFET comprising:
   an epitaxial layer of a first conductivity type extending over a substrate;
   a plurality of first type trenches formed in said epitaxial layer in an active area, each of said first type trenches being filled with a shielded gate structure comprising a first poly-silicon layer in a lower portion to serve as a shielded electrode and a second poly-silicon layer in an upper portion to serve as a gate electrode, wherein said shielded electrode is insulated from said epitaxial layer by a first insulating film and said gate electrode is insulated from said epitaxial layer by a gate insulating film which has a thickness less than said first insulating film, wherein said shielded electrode and said gate electrode are insulated from each other by a second insulating film;
   an ESD clamp diode comprising said second poly-silicon layer formed on top of said epitaxial layer and multiple second type trenches, wherein each of said second type trenches is filled with said first poly-silicon layer as a single electrode;
   said ESD clamp diode being isolated from said epitaxial layer by said gate insulating film, and being isolated from said single electrode by said second insulating film, said single electrode being isolated from said epitaxial layer by said first insulating film;
   said first and second poly-silicon layers being doped with said first conductivity type; and
   trenched anode (cathode) contacts of said ESD clamp diode being located above said multiple second trenches.

2. The SGT MOSFET of claim 1, wherein said ESD clamp diode is consisted of at least one pair of back to back Zener diodes comprising multiple alternatively arranged doped regions of said first conductivity type and doped regions of a second conductivity type opposite to said first conductivity type.

3. The SGT MOSFET of claim 1, wherein said active area further comprises source regions of said first conductivity type and body regions of a second conductivity type, wherein said source regions and said body regions are connected to a source metal through trenched source-body contacts filled with a contact metal plug which is tungsten metal layer padded by a barrier layer of Ti/TIN or Co/TiN or Ta/TiN.

4. The SGT MOSFET of claim 1, wherein said shielded electrode is connected to an outlet part for the shielded electrode to further be shorted to a source metal through a trenched shielded electrode contact filled with a contact metal plug, wherein said outlet part for the shielded electrode is formed by said first poly-silicon layer in a third type trench and said contact metal plug is tungsten metal layer padded by a barrier layer of Ti/TIN or Co/TiN or Ta/TiN.

5. The SGT MOSFET of claim 1, wherein said gate electrode is connected to a wider gate electrode to further be shorted to a gate metal through a trenched gate contact filled with a contact metal plug, wherein said wider gate electrode is formed at a same step as said gate electrode in a fourth type trench having a greater trench width than said first type trenches and said contact metal plug is tungsten metal layer padded by a barrier layer of Ti/TIN or Co/TiN or Ta/TiN.

* * * * *